(12) United States Patent
Li et al.

(10) Patent No.: US 7,391,112 B2
(45) Date of Patent: Jun. 24, 2008

(54) CAPPING COPPER BUMPS

(75) Inventors: Jianxing Li, Albuquerque, NM (US); Ming Fang, Portland, OR (US); Ting Zhong, Tigard, OR (US); Fay Hua, San Jose, CA (US); Kevin J. Lee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 231 days.

(21) Appl. No.: 11/142,971

(22) Filed: Jun. 1, 2005

(65) Prior Publication Data
US 2006/0276022 A1 Dec. 7, 2006

(51) Int. Cl.
*H01L 23/48* (2006.01)
*H01L 23/52* (2006.01)
*H01L 29/40* (2006.01)

(52) U.S. Cl. .................. 257/737; 257/738; 257/772; 257/779; 257/E23.021; 257/E23.033; 257/E23.069; 257/E21.508

(58) Field of Classification Search .......... 257/666–677, 257/737, 738, E23.021, E23.031–E23.059, 257/E23.069, E21.508, 751, 762, 772–774, 257/776–784; 438/612–617; 280/180.22
See application file for complete search history.

(56) References Cited

U.S. PATENT DOCUMENTS 7,122,460 B2 * 10/2006 Hua ........................... 438/614

OTHER PUBLICATIONS

U.S. Appl. No. 11/078,611, filed Mar. 11, 2005, "Forming A Barrier Layer In Joint Structures", Zhong et al.
U.S. Appl. No. 10/957,117, filed Sep. 30, 2004, "Methods to Deposit Metal Alloy Barrier Layers", Zhong et al.

* cited by examiner

*Primary Examiner*—Jasmine Clark
(74) *Attorney, Agent, or Firm*—Blakely, Sokoloff, Taylor & Zafman LLP

(57) ABSTRACT

A structure including a substrate, a copper bump formed over the substrate, and a barrier layer comprising an alloy of at least one of iron and nickel, formed over the copper bump, and methods to make such a structure.

6 Claims, 2 Drawing Sheets

CAPPING COPPER BUMPS

BACKGROUND

Integrated circuits (ICs) such as processors are manufactured in various types of packages. In one type of package, the IC is provided as a semiconductor die that is housed within the package and the package serves to encapsulate and protect the die and to provide connectivity between the IC implemented by the die and a device, such as a computer, within which the circuit is installed.

Tin-based solder connections may be used to electrically connect the die to the package, using a structure such as a ball grid array (BGA) or pin grid array (PGA), in a flip-chip process. The flip-chip process is used to electrically connect the die to the package carrier. The package carrier, such as a substrate or a leadframe, then provides the connection from the die to the exterior of the package. The interconnection between the die and the carrier in flip chip packaging is made through a conductive "bump" that is placed directly on the die surface. That bump may be formed of copper. The bumped die is then flipped over and aligned with tin-based solder bumps formed on the package carrier. The copper bumped die is attached to the package carrier through a metallic bond formed between the copper bumps on the die and the tin-based solder bumps on the package carrier. This metallic bond is formed by reflowing the tin-based solder to attach the solder to the copper bumps on the die. The direct contact of the copper of the copper bumps with the tin-based solder causes the diffusion of the copper from the copper bumps and the tin from the solder to form copper-tin intermetallic compounds, which are necessary for a solid metallic bond. However, excessive compound build-up has detrimental effects such as the creation of a brittle bond, high bump contact resistance and high joule heating. The diffusion of the copper and of the tin creates voids within the connection between the die and the package carrier. The voids cause shorts, excessive heat, and may cause eventual failure of the device.

DETAILED DESCRIPTION

As is known in the art, the maximum current capability (Imax) and reliability of a connection formed between a copper bump on a die substrate and its package by a soldering reflow process is affected by the formation of a layer of copper-tin (Cu—Sn) intermetallic compounds (IMCs) at the interface between the copper bump and the package terminal, typically a solder ball or bump. The Cu—Sn IMC has a high growth rate, and thus the IMC layer at the joint becomes thick and porous due to the known Kirkendall effect and high current density. Increased thickness of the intermetallic compound and Kirkendall voids formed within the compound cause high contact resistance and reduce connection reliability because of the brittle nature of the IMC.

Iron (Fe) has a much slower reaction rate with tin (Sn) than copper. In one embodiment, an iron or iron alloy cap layer on a copper bump acts as a barrier to the reaction between copper from the bump and tin from the solder. A Fe—Sn IMC layer that is formed in this embodiment generally has a lower thickness, fewer Kirkendall voids, and lower contact resistance than the Cu—Sn IMC that would be formed in the absence of the cap layer. In one embodiment with an iron alloy cap layer, the reaction rate between iron and tin is very slow after an initial formation of a 0.1 to 0.2 micron think layer of Fe—Sn IMC, probably due to further reaction being inhibited by the initially formed layer.

In other embodiments, a nickel or iron-nickel alloy cap may be used. Nickel has properties similar to those of iron in terms of how IMC layers are formed between nickel and tin, and thus a Ni—Sn IMC layer formed between a copper bump with a nickel or iron-nickel alloy cap and a package solder ball or bump is also of lower thickness and contact resistance than a Cu—Sn IMC layer formed between an un-capped copper bump and a package solder ball or bump.

Figure 1:
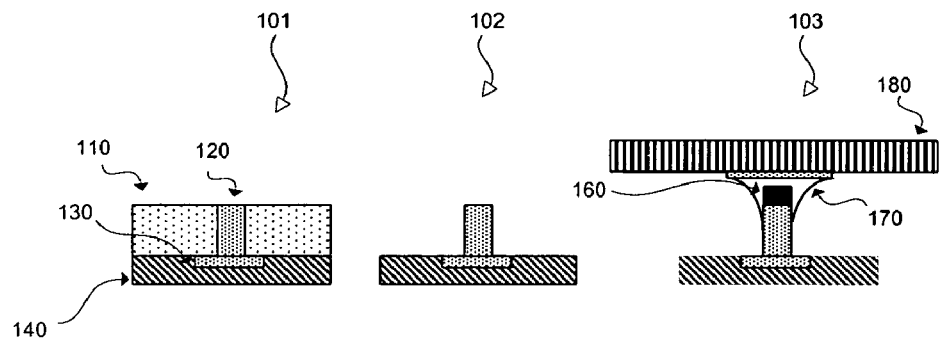
FIG. 1 (Prior Art) depicts process phases in the formation of a copper bump by electroplating and connection of the bump with a package.

FIG. 1 (prior art) shows process phases of a fabrication process in which a copper bump 120 is formed on the substrate or inter-layer dielectric of a fabricated integrated circuit die 140. The copper bump is formed by electroplating an aperture in a photo-resistive mask 110 over a copper pad 130 formed in the substrate in process phase 101. Once the copper bump is formed by an electroplating process, the photoresist may be stripped away, as known in the art, in a process phase 102 leaving the exposed copper bump. The die may then be attached to a package 180 as in the process stage depicted at 103 by a solder reflow process. As is known the copper bump and the tin in the reflowed solder 170 react to form a thick Cu—Sn IMC layer 160.

In one embodiment depicted in FIG. 2, an electroplating process is used in stage 201 to create a copper bump as previously described with reference to FIG. 1. Another cap or barrier layer 210 is then plated over the copper bump. This barrier layer is formed of a ferrous or nickel or a combination ferro-nickel (Fe—Ni) alloy. Finally, in the depicted embodiment, a pre-tin layer is formed over the barrier layer, 220. The pre-tin layer may be formed by electroplating an alloy of tin, indium, or a noble metal such as silver, gold or palladium over the copper bump. In a next phase of the process, 202, the photoresist 110 is stripped away to expose the capped copper bump with a pre-tin layer. This bump may then be coupled to a package 180 by a reflow soldering process as depicted at 203. In this embodiment, though a Fe—Sn or Ni—Sn IMC 240 may be formed by reaction of the barrier layer with the tin in the reflowed solder 170, the thickness of the layer 240 is smaller than the thickness of the layer formed when no barrier is present as depicted in FIG. 1 at 160.

Figure 2:
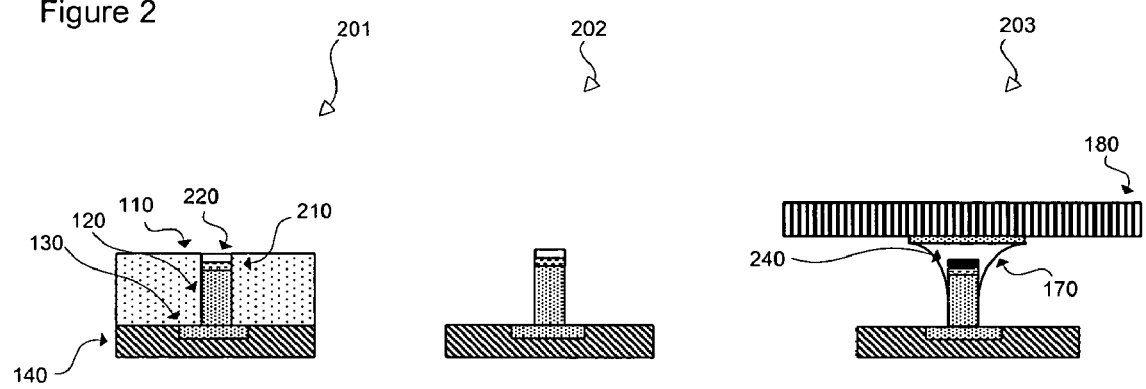
FIG. 2 depicts process phases in the formation of a copper bump with a cap by electroplating and connection of the bump with a package in one embodiment

A variation on the process of FIG. 2 similar to that depicted in FIG. 2 in which the formation of a pre-tin layer is omitted would still have the feature of a thinner IMC and may be used in some embodiments.

Figure 3:
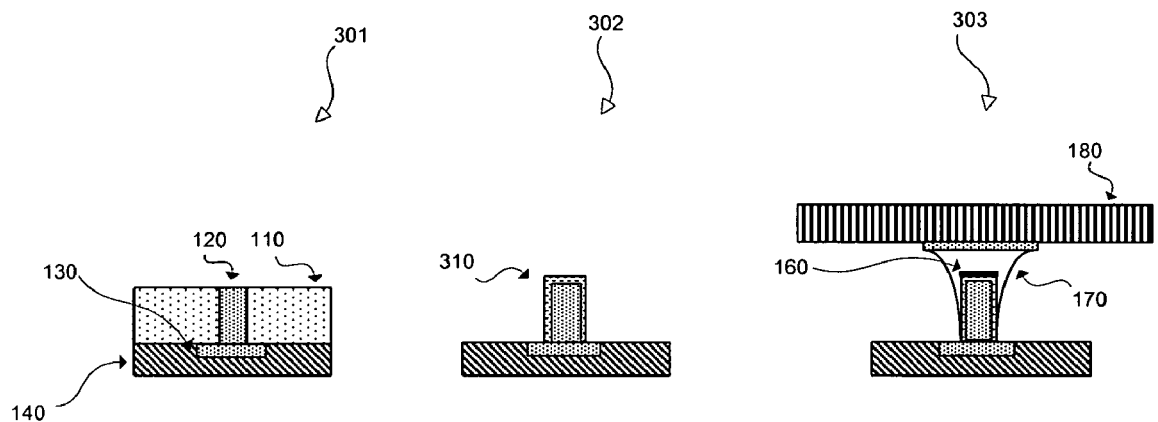
FIG. 3 depicts process phases in the formation of a cap by electroless plating on a copper bump and connection of the bump with a package in one embodiment.

FIG. 3 depicts a process and structure embodiment in which the first stage is similar to that described earlier with reference to FIG. 1, starting with the formation of a copper bump by electroplating in 301. After the photoresist is stripped away, a layer of barrier metal 310 made of either a ferrous or nickel alloy or a combination Fe—Ni alloy is formed over substantially the entire surface of the copper bump by an electroless plating process as depicted in stage 302. In stage 303, a depiction of the formation of a connection with a package shows the copper bump with the electroless barrier and the formation of a thin intermetallic layer. Because Fe or Ni has a slower reaction rate with Sn than Cu, a thinner intermetallic layer 160 is formed than those formed in the previously discussed versions in this embodiment.

Variations of the embodiment depicted in FIG. 3 include the addition of a pre-tin formed over the barrier 310 layer by either electroplating or electroless plating in order to improve the reflow process of connection to a package with solder bumps or balls.

Figure 4:
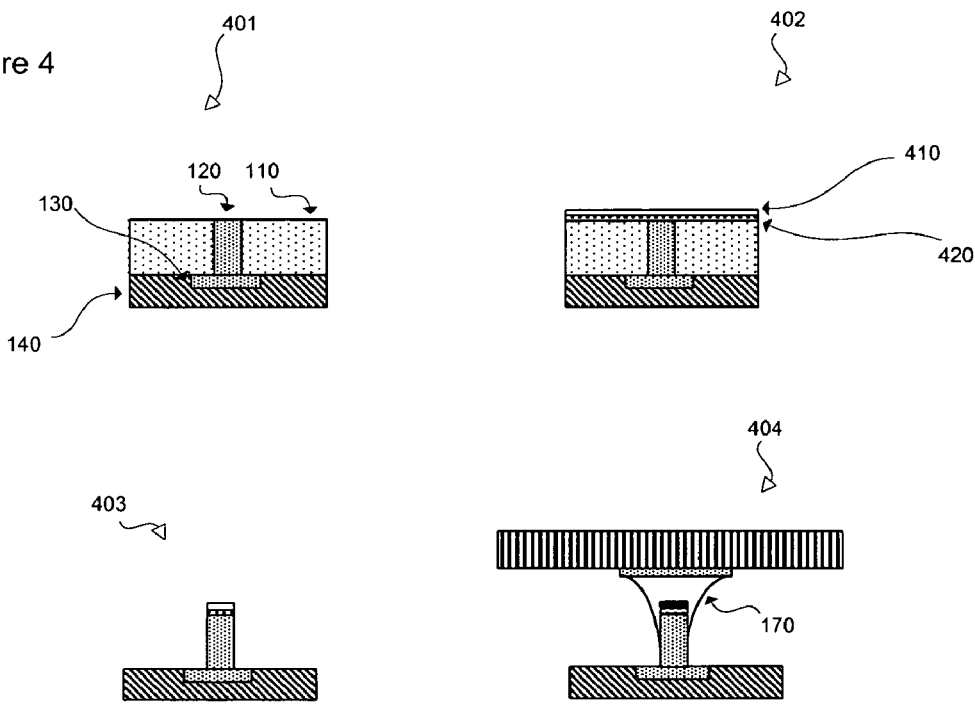
FIG. 4 depicts process phases in the formation of a cap by physical vapor deposition on a copper bump and connection of the bump with a package in one embodiment.

In FIG. 4, another embodiment is depicted. In this embodiment, a copper bump is formed as previously discussed, at 401. After the formation of the bump, the photoresist 110 is retained and a physical vapor deposition process is used to form a layer of barrier metal 420 such as a Fe, Ni, or Fe—Ni alloy over the copper bump and resist layer as depicted at process phase 402. In some embodiments, a pre-tin layer 410 may be further deposited over the barrier layer as well. Other embodiments may omit this layer.

The excess pre-tin layer, barrier layer metal and photoresist are then removed by a lithography, etch, and photoresist stripping process as is known in the art. This leaves a copper bump with a barrier layer and pre-tin layer as depicted at 403. When connected to a package by a reflow process as depicted at 404, a thin IMC is formed between the barrier alloy and the tin in the reflowed solder.

Many other embodiments of the claimed subject matter are possible. Many modifications may be made to adapt the teachings of the description and the drawings to a particular situation without departing from their scope. Therefore, it is intended that the claimed subject matter not be limited to the various exemplary embodiments disclosed in the description and the drawings, but rather to all embodiments falling within the scope of the claims below.

What is claimed is:

1. A structure comprising:
   a substrate;
   a copper bump formed over the substrate;
   and a barrier layer comprising an alloy of at least one of iron and nickel,
   formed over the copper bump;
   a pre-tin solder layer over the barrier layer, the pre-tin solder layer including an alloy comprising at least one of tin, indium, silver, gold, and palladium; and
   a solder bump soldered to the pre-tin solder layer.

2. The structure of claim 1 further comprising a solder bump soldered to the barrier layer formed over the copper bump.

3. A package comprising:
   a die comprising a substrate and a copper bump formed over the substrate;
   a barrier layer comprising an alloy of at least one of iron and nickel, the barrier layer being formed over the copper bump;
   a pre-tin solder layer over the barrier layer; and
   a package carrier comprising a solder bump coupled to the die.

4. The package of claim 3 wherein the pre-tin solder layer comprises an alloy, the alloy further comprising at least one of tin, indium, silver, gold, and palladium.

5. The package of claim 4 wherein the solder bump is coupled to the die by a reflowed solder connection formed between the solder bump and the pre-tin solder layer formed over the copper bump.

6. The package of claim 3 wherein the solder bump is coupled to the die by a reflowed solder connection formed between the solder bump and the barrier layer formed over the copper bump.

* * * * *